United States Patent

Biebl et al.

[11] Patent Number: 5,913,115
[45] Date of Patent: Jun. 15, 1999

[54] METHOD FOR PRODUCING A CMOS CIRCUIT

[75] Inventors: Markus Biebl, Augsburg; Udo Schwalke, Heldenstein; Herbert Schaefer, Hoehenkirchen-Sieg. Brunn; Dirk Schumann, Munich, all of Germany

[73] Assignee: Siemens Aktiengesellschaft, Munich, Germany

[21] Appl. No.: 09/067,766

[22] Filed: Apr. 29, 1998

[30] Foreign Application Priority Data

Apr. 29, 1997 [DE] Germany .................... 197 18 165

[51] Int. Cl.⁶ .................................................. H01L 21/265
[52] U.S. Cl. ...................... 438/222; 438/219; 438/225; 257/371
[58] Field of Search ...................... 438/219, 221, 438/222, 225, 226, 231; 257/371

[56] References Cited

U.S. PATENT DOCUMENTS

| | | |
|---|---|---|
| 4,041,518 | 8/1977 | Shimizu et al. . |
| 4,590,663 | 5/1986 | Haken ................................ 438/231 |
| 5,252,501 | 10/1993 | Moslehi ................................ 257/371 |
| 5,504,031 | 4/1996 | Hsu et al. . |
| 5,571,733 | 11/1996 | Wu et al. . |
| 5,654,213 | 8/1997 | Choi .................................. 438/231 |
| 5,670,397 | 9/1997 | Chang et al. ....................... 438/226 |

FOREIGN PATENT DOCUMENTS

| | | |
|---|---|---|
| 0 268 941 | 6/1988 | European Pat. Off. . |
| 0 268 941B1 | 6/1988 | European Pat. Off. . |
| 0 393 215 | 10/1990 | European Pat. Off. . |
| 3-220730 | 9/1991 | Japan . |

*Primary Examiner*—Charles Bowers
*Assistant Examiner*—David S Blum
*Attorney, Agent, or Firm*—Hill & Simpson

[57] ABSTRACT

In producing a CMOS circuit, an n-channel MOS transistor and a p-channel MOS transistor are formed in a semiconductor substrate. In situ p-doped, monocrystalline silicon structures are formed by epitaxial growth selectively with respect to insulating material and with respect to n-doped silicon, such silicon structures being suitable as a diffusion source for forming source/drain regions of the p-channel MOS transistor. The source/drain regions of the n-channel MOS transistor are produced beforehand by means of implantation or diffusion. Owing to the selectivity of the epitaxy that is used, it is not necessary to cover the n-doped source/drain regions of the n-channel MOS transistor during the production of the p-channel MOS transistor.

7 Claims, 3 Drawing Sheets

METHOD FOR PRODUCING A CMOS CIRCUIT

BACKGROUND OF THE INVENTION

1. Field of the Invention

The present invention relates to a method for producing a CMOS circuit having both an n-channel MOS transistor and a p-channel MOS transistor formed in a semiconductor substrate wherein a masking step is alleviated in the formation of the CMOS circuit thus reducing the overall process outlay.

2. Description of the Prior Art

In the course of miniaturizing components with a view toward increased component density, both lateral and vertical dimensions are reduced. In the case of MOS transistors, this means that not only the lateral dimensions of the gate electrode and the channel length but also the depth of the source/drain regions is reduced.

EP 0 268 941 B1 has proposed a MOS field-effect transistor structure with shallow source/drain zones. The MOS field-effect transistor is arranged between field oxide regions. Monocrystalline, doped silicon layers are arranged between the gate electrode of the MOS transistor and the field oxide regions. Such silicon layers are produced by means of selective epitaxy and service as diffusion sources for producing the source/drain regions. They also form the connection regions with respect to the source/drain terminals arranged above them.

In order to produce a CMOS circuit with complementary MOS transistors, it was proposed in EP 0 268 941 B1, that the monocrystalline doped silicon layers produced by means of selective epitaxy be doped differently. This can be done either by forming an undoped silicon layer or by means of selective epitaxy, both in the region of the n-channel transistors and in the region of the p-channel transistors. The silicon layers are then doped differently, depending on the transistor type, by means of implantation using two masks. As an alternative, n$^+$-doped, monocrystalline silicon layers are, first of all, produced by means of selective epitaxy. In this case, regions for p-channel transistors are covered by a mask. Afterwards, the regions for n-channel transistors are covered by a further mask and p$^+$-doped n-crystalline silicon layers are formed by means of selective epitaxy. In both cases, two mask steps are necessary to produce the differently doped source/drain regions.

SUMMARY OF THE INVENTION

The present invention, therefore, is based on the problem of specifying a method for producing a CMOS circuit in which the process outlay is reduced. According to the principles of the present invention, such problem is solved by the fact that an n-channel MOS transistor and a p-channel -MOS transistor are formed in a semiconductor substrate. In order to form the p-channel MOS transistor, a first gate dielectric and a first gate electrode, whose flanks are provided with insulating spacers, are produced. Therefore, p-doped, monocrystalline silicon structures are formed, by means of selective epitaxy, laterally with respect to the first gate electrode. The p-doped, monocrystalline silicon structures are suitable as a diffusion source for forming source/drain regions of the p-channel MOS transistor. In this case, the selective epitaxy is carried out in such a way that deposition of silicon on surfaces made of insulating material and made of n-doped silicon is suppressed. This exploits the fact that silicon deposition takes place more slowly by a factor of 5 to 20 in the case of in situ n-doped selective epitaxy than in the case of undoped selective epitaxy or in situ p-doped selective epitaxy. During the selective epitaxy for forming p-doped, monocrystalline silicon structures, n-doped silicon regions act locally as a dopant source on the surface of which only n-doped silicon can grow. As a result of this measure, n-doped silicon regions, or regions made of insulated material, need not be covered with a separate mask while the p-doped monocrystalline silicon structures are formed. In this way, a mask is saved in the formation of the CMOS circuit. That means a reduced process outlay.

According to the present invention, after the formation of the first gate dielectric and the first gate electrode for the p-channel MOS transistor, and after the formation of a second gate dielectric and a second gate electrode for the n-channel MOS transistor, whose flanks are provided with insulating spacers, a mask is formed which covers an active region for the p-channel MOS transistor. n-doped source/drain regions for the n-channel MOS transistor are subsequently formed by means of ion implantation. After the removal of the mask, the selective epitaxy for forming the p-doped, monocrystalline silicon structures is carried out. Finally, the source/drain regions of the p-channel MOS transistor are formed by outdiffusion from the p-doped, monocrystalline silicon structures.

In a further embodiment, after the formation of the first gate dielectric, first gate electrode, second gate dielectric and second gate electrode for the p-channel MOS transistor and the n-channel MOS transistor, and after the production of insulating spacers on the flanks of the first gate electrode and of the second gate electrode, a mask is formed which covers the active region of the p-channel MOS transistor. n-doped monocrystalline silicon structures are formed by means of selective epitaxy and are suitable as a diffusion source for forming source/drain regions of the n-channel MOS transistor. Afterwards, the mask is removed and the selective epitaxy for forming the p-doped, monocrystalline silicon structures is carried out. Since this selective epitaxy is selective with respect to insulating material and with respect to n-doped silicon, the p-doped, monocrystalline silicon structures do not grow in the region of the n-channel MOS transistor. The source/drain regions of the p-channel MOS transistor are formed by outdiffusion from the p-doped, monocrystalline silicon structures, and the source/drain regions of the n-channel MOS transistor are formed by outdiffusion from the n-doped, monocrystalline silicon structures.

In both exemplary embodiments, in the manner that is customary in CMOS technology, insulation structures are formed which, in each case, define the active regions for the n-channel MOS transistors and the p-channel MOS transistors. Furthermore, if necessary, n-doped wells and/or p-doped wells for accommodating the p-channel MOS transistors and/or n-channel MOS transistors are produced and channel implantations are performed.

The selective epitaxy for forming the p-doped, monocrystalline silicon structures is preferably effected using a process gas containing $H_2$, $HCl$, $SiH_2Cl_2$ and $B_2H_6$ in the temperature range between 700 and 900° C. and in the pressure range between 1 and 700 torr. Source/drain regions having a depth between 10 and 50 nm can be formed in this way. It lies within the scope of the invention to form the mask from a mask layer, especially one made of $SiO_2$, which is structured with the aid of photolithographic processing steps.

Additional features and advantages of the present invention are described, and will be apparent from, the Detailed Description of the Preferred Embodiments and from the Drawings.

DETAILED DESCRIPTION OF THE PREFERRED EMBODIMENTS

Figure 1:
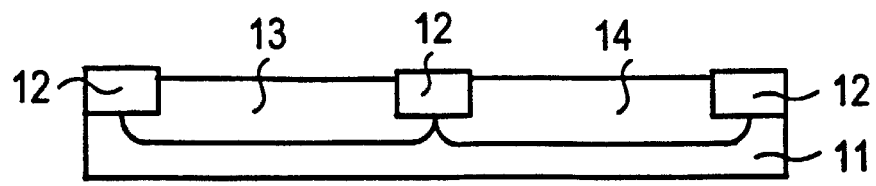
FIG. 1 shows a section through a semiconductor substrate with insulation structures and both an n-doped well and a p-doped well.

As shown in FIG. 1, insulation structures 12 are formed on a surface of a substrate; for example, of a monocrystalline silicon wafer or of the monocrystalline silicon layer of an adjacent SOI substrate. The insulation structures 12 are formed, for example, by local oxidation in a LOCOS process or by filling insulating trenches in a shallow trench insulation process (STI). Furthermore, a p-doped well 13 and an n-doped well 14 are formed in the substrate 11. The insulation structures 12 are configured in such a way that they define an active region for an n-channel MOS transistor within the p-doped well 13 and an active region for a p-channel MOS transistor within the n-doped well 14.

Figure 2:
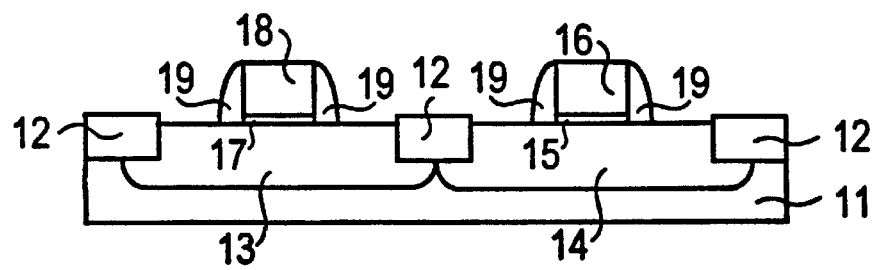
FIG. 2 shows a section through the semiconductor substrate after the formation of a gate dielectric and gate electrodes, whose flanks are provided with insulating spacers.

Referring now to FIG. 2, a first gate dielectric 15 and a first gate electrode 16 for the p-channel MOS transistor and a second gate dielectric 17 and a second gate electrode 18 for the n-channel MOS transistor are subsequently formed by whole-area application of a dielectric layer and of a conductive layer and joint structuring by means of photolithographic process steps and anisotropic etching. The first gate dielectric 15 and the second gate dielectric 17 are formed, for example, by thermal oxidation from $SiO_2$ with a layer thickness of 5 nm. The first gate electrode 16 and the second gate electrode 18 are formed, for example, from doped polysilicon and/or metal silicide with a layer thickness of 200 nm.

Insulating spacers 19 are subsequently formed on the flanks of the first gate electrode 16 and of the second gate electrode 18 by means of conformal deposition of an insulating layer. Such layer may be made, for example, of $SiO_2$ or $Si_3N_4$, with a layer thickness of 10 to 500 nm, and by means of anisotropic etching back.

Figure 3:
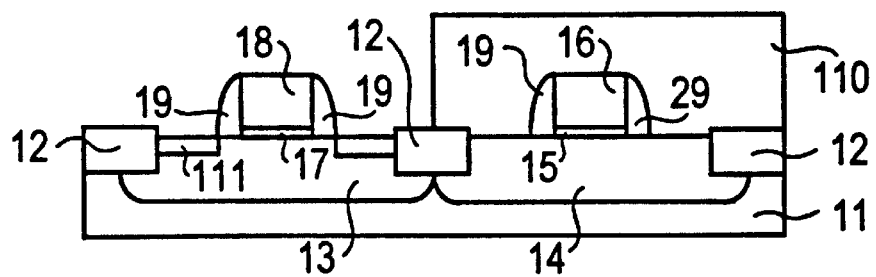
FIG. 3 shows a section through the semiconductor substrate after the formation of a mask and ion implantation for forming n-doped source/drain regions.
Figure 4:
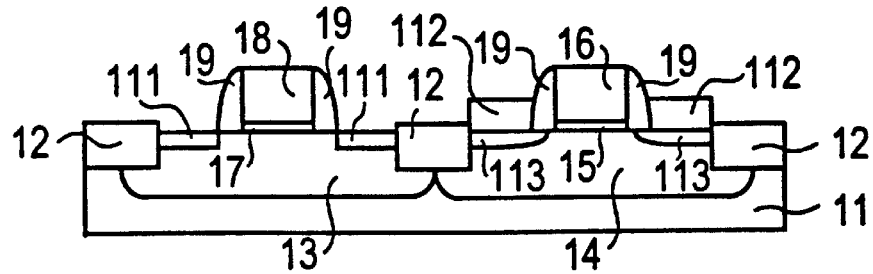
FIG. 4 shows a section through the semiconductor substrate after the removal of the mask, the formation of p-doped, monocrystalline silicon structures and the formation of p-doped source/drain regions by outdiffusion from the silicon structures.

As shown in FIGS. 3 and 4, a mask 110, which completely covers the active region for the p-channel MOS transistor, is formed by whole-area deposition of an $SiO_2$ layer to a layer thickness of 100 to 3000 nm, for example, and subsequent structuring by means of photolithographic process steps and anisotropic etching. The active region for the n-channel MOS transistor, on the other hand, is left uncovered by the mask 110. Source/drain regions 111 for the n-channel MOS transistor are subsequently formed by means of ion implantation using, for example, arsenic with an energy of 5 to 80 keV and a dose of $10^{14}$ to $10^{21}$ $cm^{-2}$.

After the removal of the mask 110 by etching in hydrofluoric acid, for example, and after preparatory cleaning steps which are necessary for epitaxy, p-doped monocrystalline silicon structures 112 are formed on the uncovered surface of the n-doped well 14 by means of in situ p-doped selective epitaxy. The process parameters are set in such a way that during the selective epitaxy, silicon is not deposited either on insulating material or on n-doped silicon. To that end, a process gas containing H2, HCl, $SiH_2Cl_2$, $B_2H_6$ is used. The selective epitaxy is carried out at a temperature in the range between 700 and 900° C. and at a pressure in the range between 1 and 700 torr. A dopant concentration of about $10^{20}$ $cm^{-3}$ is set here in the p-doped, monocrystalline silicon structures 112.

A heat-treatment process is subsequently effected, during which source/drain regions 113 for the p-channel MOS transistor are formed by outdiffusion from the p-doped, monocrystalline silicon structures 112. At the same time, the dopant in the source/drain regions 111 for the n-channel MOS transistor is activated. The depth of the source/drain regions 111 for the n-channel MOS transistor is about 20 to 200 nm, and the depth of the source/drain regions for the p-channel MOS transistor 113 is about 20 to 300 nm.

Figure 5:
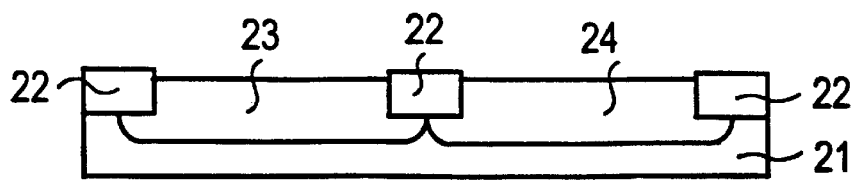
FIG. 5 shows a section through a second embodiment of a semiconductor substrate with insulation structures, an n-doped well and a p-doped well.
Figure 6:
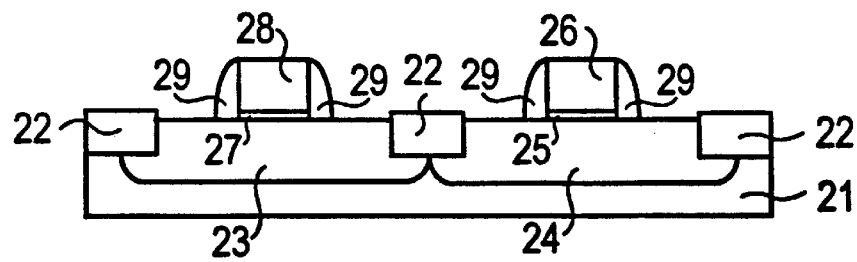
FIG. 6 shows a section through the semiconductor substrate after the formation of a gate dielectric and gate electrodes, whose flanks are provided with insulating spacers.

In further exemplary embodiment as shown in FIG. 5, an insulation structure 22, a p-doped well 23 and an n-doped well 24 are formed in a substrate 21, in a manner analogous to the first exemplary embodiment. The substrate 21 is once again a monocrystalline silicon wafer or a monocrystalline silicon layer of an SOI substrate. The insulation structure 22 is formed in a LOCOS process or in an STI process, for example. The insulation structure 22 is designed in such a way that it defines an active region for an n-channel MOS transistor in the p-doped well 23 and an active region for a p-channel MOS transistor in the n-doped well 24. In an analogous manner to that in the first exemplary embodiment, FIG. 6 shows a first gate dielectric 25 and a first gate electrode 26 are formed for the p-channel MOS transistor, and a second gate dielectric 27 and a second gate electrode 28 are formed for the n-channel MOS transistor. Insulating spacers 29 are formed on the flanks of the gate electrodes 26, 28.

Figure 7:
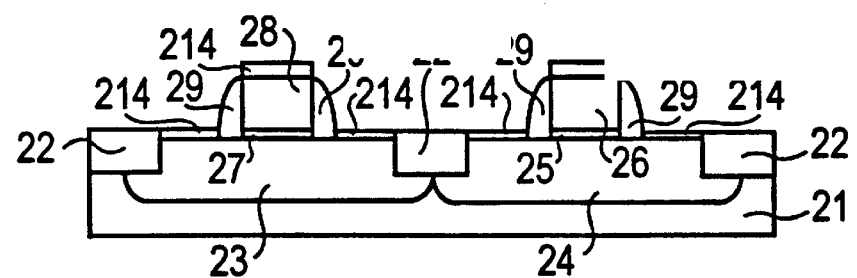
FIG. 7 shows a section through the semiconductor substrate after the reoxidation step.

Reoxidation is subsequently carried out at 800 to 1100° C., for example. As shown in FIG. 7, during the reoxidation process an $SiO_2$ layer 214 is formed with a layer thickness of about 5 to 100 nm on uncovered surfaces of the p-doped well 23, the n-doped well 24, the first gate electrode 26 and the second gate electrode 28.

Figure 8:
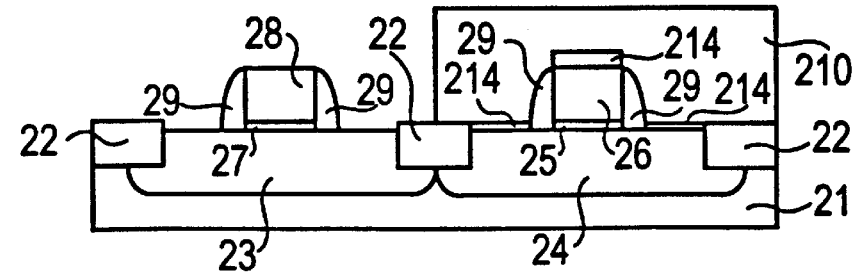
FIG. 8 shows a section through the semiconductor substrate after the formation of a mask.
Figure 9:
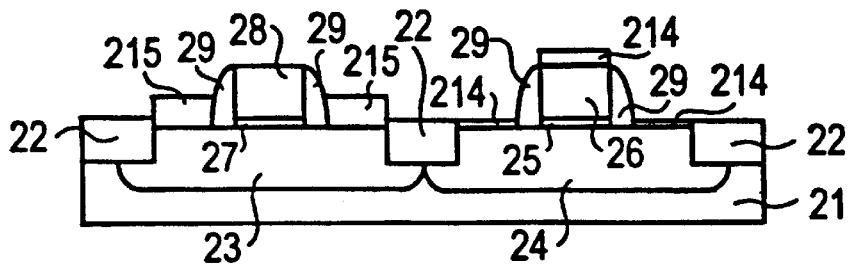
FIG. 9 shows a section through the semiconductor substrate after the growth of n-doped, monocrystalline silicon structures and after the removal of the mask.

Referring now to FIG. 8, a mask 210, which covers the active region for the p-channel MOS transistor, is subsequently formed by application of an SiO$_2$ layer with a layer thickness of 100 to 3000 nm, for example, and structuring of the SiO$_2$ layer with the aid of photolithographic methods and by means of anisotropic etching. The active region for the n-channel MOS transistor, on the other hand, is not covered by the mask 210. During the structuring of the mask 210, the surface of the p-doped well 23 is uncovered between the parts of the insulation structure 22 and the insulating spacers 29. n-doped, monocrystalline silicon structures 215 are produced by means of selective epitaxy using a process gas containing H$_2$, HCl, SiH$_2$Cl$_2$, AsH$_3$ at a temperature in the range between 700 and 900° C. and a pressure in the range between 1 and 700 torr. The epitaxy is controlled in such a way that silicon is deposited selectively on the uncovered silicon surface of the p-doped well 23 as shown in FIG. 9. By addition of the doping gas AsH$_3$, the n-doped, monocrystalline silicon structures 215 are in situ n-doped with a dopant concentration of approximately $10^{19}$ cm$^{-3}$.

Figure 10:
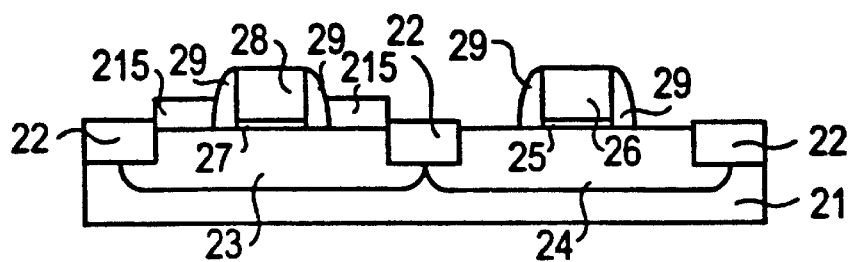
FIG. 10 shows a section through the semiconductor substrate after etching to expose the semiconductor surface in the region of the n-doped well.

The mask 210 is subsequently removed by etching, for example in hydrofluoric acid. Those parts of the SiO$_2$ layer 114 which are situated in the region of the active region for the p-channel MOS transistor are subsequently removed by means of selective etching using HF. The uncovered silicon surface of the n-doped well 14 is cleaned, as shown in FIG. 10, for subsequent epitaxy.

Figure 11:
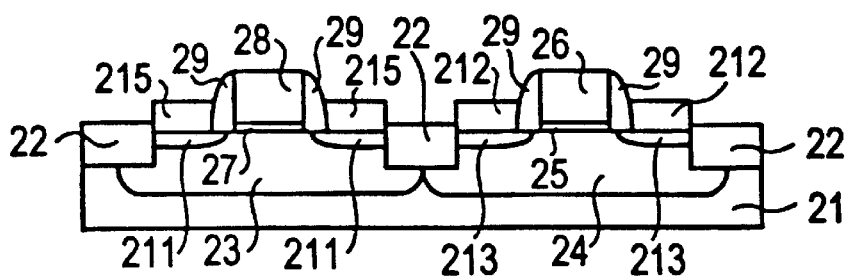
FIG. 11 shows the semiconductor substrate after the selective growth of p-doped, monocrystalline silicon structures and after a heat-treatment step for forming source/drain regions.

As noted in FIG. 11, p-doped, monocrystalline silicon structures 212 are formed on the uncovered surface of the n-doped well 24 by means of selective epitaxy of silicon doped in situ with boron. The selective epitaxy is carried out in such a way that silicon is not deposited either on the surface of insulating material or on the surface of n-doped silicon. To that end, a process gas containing H$_2$, HCl, SiH$_2$Cl$_2$, B$_2$H$_6$ is used and the epitaxy is carried out at a temperature in the range between 700 and 900° C. and a pressure between 1 and 700 torr. By the addition of the doping gas B$_2$H$_6$ during the selective epitaxy, a dopant concentration of about $10^{20}$ cm$^{-3}$ is established in the p-doped, monocrystalline silicon structure 212.

Source/drain regions 211 for the n-channel MOS transistor and source/drain regions 213 for the p-channel MOS transistor are formed in a heat-treatment step at 800 to 1100° C. The depth of the source/drain regions 111 for the n-channel MOS transistor is approximately 20 to 200 nm, and the depth of the source/drain regions 213 for the p-channel MOS transistor is about 20 to 300 nm.

Although the present invention has been described with reference to specific embodiments, those of skill in the art will recognize that changes may be made thereto without departing from the spirit and scope of the invention as set forth in the hereafter appended claims.

We claim as our invention:

1. A method for producing a CMOS circuit having both an n-channel MOS transistor and a p-channel MOS transistor formed in a semiconductor substrate, comprising the steps of:

forming a first gate electrode on the semiconductor substrate, the first gate electrode having flanks covered with insulating spacers;

forming a second gate electrode on the semiconductor substrate, the second gate electrode having flanks covered with insulating spacers;

forming n-doped source/drain regions for the n-channel MOS transistor by means of ion implantation with n-doping ions; and forming p-doped, monocrystaline silicon structures by means of selective epitaxy laterally with respect to the first gate electrode, the silicon structures being suitable as a diffusion source for forming source/drain regions of the p-channel MOS transistor, and wherein, during the selective epitaxy, the insulating spacers and the n-doped source/drain regions remain exposed yet no silicon is deposited thereon.

2. A method as claimed in claim 1, further comprising the steps of:

forming insulation structures in the semiconductor substrate, the insulation structures defining active regions for both the n-channel MOS transistor and the p-channel MOS transistor;

forming both a first gate dielectric and the first gate electrode for the p-channel MOS transistor;

forming both a second gate dielectric and a second gate electrode for the n-channel MOS transistor;

forming insulating spacers on the flanks of the first gate electrode and on flanks of the second gate electrode;

forming a mask over the active region of the p-channel MOS transistor;

forming source/drain regions for the n-channel MOS transistor by means of ion implantation with n-doping ions;

removing the mask prior to performing the selective epitaxy for forming the p-doped, monocrystalline silicon structure; and forming source/drain regions of the p-channel MOS transistor by outdiffusion from the p-doped, monocrystalline silicon structures.

3. A method as claimed in claim 1, further comprising the steps of:

forming insulation structures in the semiconductor substrate, the insulation structures defining active regions for the n-channel MOS transistor and the p-channel MOS transistor;

forming both a first gate dielectric and the first gate electrode for the p-channel MOS transistor;

forming both a second gate dielectric and a second gate electrode for the n-channel MOS transistor;

forming insulating spacers on the flanks of the first gate electrode and on flanks of the second gate electrode;

forming a mask over the active region of the p-channel MOS transistor;

forming n-doped, monocrystalline silicon structures, which are suitable as a diffusion source for forming source/drain regions of the n-channel MOS transistor by means of selective epitaxy;

removing the mask prior to performing selective epitaxy for forming the p-doped, monocrystalline silicon structures;

forming the source/drain regions of the p-channel MOS transistor by outdiffusion from the p-doped, monocrystalline silicon structures; and forming the source/drain regions of the n-channel MOS transistor by outdiffusion from the n-doped, monocrystalline silicon structures.

4. A method as claimed in claim 1, further comprising the step of:

using a process gas containing H$_2$, SiH$_2$Cl$_2$, B$_2$H$_6$ in the temperature range between 700 and 900° C. and in the pressure range between 1 and 700 torr for performing the selective epitaxy for forming the p-doped, monocrystalline silicon structures.

5. A method as claimed in claim 1, wherein the source/drain regions are formed with a depth between 20 and 300 nm.

6. A method as claimed in claim 2, further comprising the steps of:

depositing a mask layer for the purpose of forming the mask;

forming a photoresist mask; and structuring the mask layer using the photoresist mask.

7. A method as claimed in claim 6, wherein the mask layer is formed from $SiO_2$.

* * * * *